(12) United States Patent
Liu et al.

(10) Patent No.: US 9,786,655 B2
(45) Date of Patent: Oct. 10, 2017

(54) DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Hanqing Liu, Beijing (CN); Pengju Zhang, Beijing (CN); Bin Zhao, Beijing (CN); Gang Yu, Beijing (CN); Detao Zhao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/184,540

(22) Filed: Jun. 16, 2016

(65) Prior Publication Data

US 2017/0084605 A1 Mar. 23, 2017

(30) Foreign Application Priority Data

Sep. 23, 2015 (CN) .......................... 2015 1 0613281

(51) Int. Cl.
| | |
|---|---|
| H01L 27/02 | (2006.01) |
| H01L 27/12 | (2006.01) |
| G02B 6/42 | (2006.01) |
| H01L 27/28 | (2006.01) |
| H05K 1/02 | (2006.01) |

(52) U.S. Cl.
CPC ........ *H01L 27/0292* (2013.01); *G02B 6/4275* (2013.01); *H01L 27/124* (2013.01); *H01L 27/288* (2013.01); *H05K 1/0259* (2013.01)

(58) Field of Classification Search
CPC ............. H01L 27/0248; H01L 27/0288; H01L 27/0292; G02B 6/4275; H05K 1/0259
See application file for complete search history.

*Primary Examiner* — Tom Thomas
*Assistant Examiner* — John Bodnar
(74) *Attorney, Agent, or Firm* — Ladas & Parry LLP; Loren K. Thompson

(57) ABSTRACT

A display panel and a display device are provided. The display panel includes an array substrate and an opposite substrate arranged oppositely; a sealant disposed in non-display areas; and a peripheral wiring disposed in the non-display areas of the array substrate and/or the opposite substrate and including at least one electrostatic discharge (ESD) structure.

18 Claims, 2 Drawing Sheets

DISPLAY PANEL AND DISPLAY DEVICE

TECHNICAL FILED

Embodiments of the present disclosure relate to a display panel and a display device.

BACKGROUND

Static electricity is a natural phenomenon and is produced by a variety of ways, such as contact and friction. Static electricity is everywhere in our daily life. High electrostatic voltage, several thousand volts or even tens of thousands of volts, is in our body and around us. For some electrostatic sensitive components, normal performances thereof may be directly lost due to static electricity, and even normal functions may be completely lost. Thus, electrostatic protection is a timeless problem in the manufacturing field of display panels.

SUMMARY

Embodiments of the present disclosure provide a display panel and a display device.

At least one embodiment of the present disclosure provides a display panel, which includes an array substrate and an opposite substrate which are arranged oppositely, and a sealant disposed in non-display areas of the array substrate and the opposite substrate. The display panel further includes: a peripheral wiring being disposed in the non-display area of the array substrate and/or the opposite substrate and including at least one electrostatic discharge (ESD) structure.

In an example, the sealant includes filling material in an area corresponding to the ESD structure; and the filling material includes conductive material wrapped by insulating material. The insulating material is insulated at normal temperature and melted when the temperature exceeds a preset temperature threshold. The conductive material is melted when the temperature exceeds the preset temperature threshold. The preset temperature threshold is a temperature value produced when the ESD structure is struck by static electricity.

In an example, the ESD structure includes a part of the peripheral wiring; and the ESD structure has a total width not greater than that of the peripheral wiring in other parts without the ESD structure.

In an example, the ESD structure has resistance greater than that of the peripheral wiring in other parts without the ESD structure.

In an example, the ESD structure includes a tip and/or corner structure.

In an example, the ESD structure has a total length of wiring per unit area greater than that of the peripheral wiring in other parts without the ESD structure.

In an example, the ESD structure includes at least one of S-shaped structure and at least one of Z-shaped structure.

In an example, the ESD structure includes at least one of S-shaped structure.

In an example, the ESD structure includes at least one of Z-shaped structure.

In an example, the peripheral wiring includes a signal line configured to transmit signals during operation of the display panel and an ESD wiring disposed in the non-display area.

In an example, the peripheral wiring includes a signal line configured to transmit signals during operation of the display panel.

In an example, the peripheral wiring includes an ESD wiring disposed in the non-display area.

In an example, the display panel further includes at least one barrier layer disposed between the filling material of the sealant and the ESD structure. The barrier layer is made from insulating material which can be melted when the temperature exceeds the preset temperature threshold.

In an example, the peripheral wiring includes four ESD structures respectively disposed in four corners of the peripheral wiring.

At least one embodiment of the present disclosure provides a display device, which includes the display panel.

BRIEF DESCRIPTION OF DRAWINGS

Embodiments of the present disclosure will be described in more detail as below in conjunction with the accompanying drawings to enable those skilled in the art to understand the present disclosure more clearly, in which.

DETAILED DESCRIPTION

Figure 1:
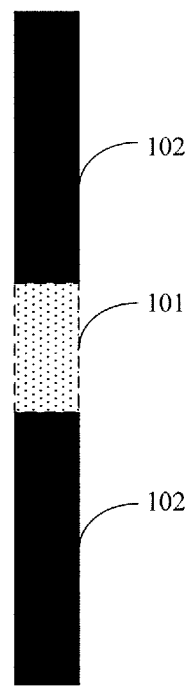
FIG. 1 is a schematic diagram illustrating the relative positional relationship between an ESD structure and a peripheral wiring, provided by an embodiment of the present disclosure.

Technical solutions according to the embodiments of the present disclosure will be described clearly and thoroughly as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "the," or the like, are not intended to limit the amount, but for indicating the existence of at lease one. Also, the terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Currently, manufacturers of cell phone have higher and higher requirement on the anti-static capability of display panels. In the last ten years, backlight modules of most cell phones adopt the design of metal frame, so that the display panel can be protected by the metal frame, and the possibility of directly subjecting an electrostatic shock can be reduced. With the continuous competition in the cell phone market, thinner display panel modules and narrower bezel have become new market requirements. The inventor noticed that the antistatic problem of this type of cell phones must be solved as the backlight module does not adopt the design of the metal frame but adopts lighter and thinner polyvinyl chloride (PVC) material and the peripheral bezel is no longer wrapped the entire panel.

At least one embodiment of the present disclosure provides a display panel, which includes an array substrate and an opposite substrate arranged oppositely, and a sealant disposed in non-display areas of the array substrate and the opposite substrate. The display panel further includes a peripheral wiring disposed in the non-display areas of the array substrate and/or the opposite substrate and including at least one ESD structure.

The sealant includes filling material in an area corresponding to the ESD structure; and the filling material includes conductive material wrapped by insulating material. The insulating material is insulated at normal temperature and melted when the temperature exceeds a preset temperature threshold. The conductive material is melted when the temperature exceeds the preset temperature threshold. The preset temperature threshold is a temperature value produced when the ESD structure is struck by static electricity.

FIG. 1 is a schematic diagram illustrating the relative positional relationship between an ESD structure 101 and a peripheral wiring, provided by an embodiment of the present disclosure. It is noted that FIG. 1 is only used for illustrating the positional relationship between the ESD structure and the peripheral wiring, which is not a structural view of an actual shape, and it does not indicate that the ESD structure 101 is a structure having width the same as that of the peripheral wiring, instead, it is to show that the ESD structure is a structure which is connected with the peripheral wiring and can be easily shocked, for example.

The display panel provided by the embodiment of the present disclosure includes the array substrate and the opposite substrate which are arranged oppositely and the sealant disposed in the non-display areas of the array substrate and the opposite substrate, and it also includes the peripheral wiring structure as shown in FIG. 1 disposed in the non-display areas of the array substrate and/or the opposite substrate. The peripheral wiring 102 includes an ESD structure 101. The ESD structure 101 is an integral structure connected with the peripheral wiring 102. For instance, an ESD structure 101 may be formed by etching a section of the peripheral wiring, or an ESD structure 101 may be connected between two peripheral wiring portions 102 to form a complete wiring.

For instance, in order to better coordinate the use of the ESD structure 101, filling material is added in the sealant in an embodiment of the present disclosure. For instance, the filling material is added into the sealant in an area corresponding to the ESD structure 101. The filling material is conductive material wrapped by insulating material. The insulating material is insulated at normal temperature and melted when the temperature exceeds a preset temperature threshold. The conductive material is material (e.g., metal or conductive substances) which is melted when the temperature exceeds the preset temperature threshold. That is to say, at normal temperature, the insulating material is insulated, and at this point, the conductive material wrapped by the insulating material cannot be conductive electrically. When the display panel is subjected to an electrostatic shock, static electricity may be discharged at the ESD structure of the peripheral wiring; when the ESD temperature reaches a preset temperature threshold (e.g., 300 Celsius degree) by the static shock, the ESD structure 101 subjected to a shock is damaged, and both the insulating material and the conductive material will be melted; and the melted conductive material will repair the damaged position and the ESD structure 101 for discharging static electricity, so that the ESD structure 101 which is shocked by the static electricity can be converted into a wiring with normal function. In this way, the peripheral circuit can continue its role of anti-static shock if another electrostatic shock happens, and the display panel can have high anti-static capability in a long time.

Detailed description will be given below to the structure and the characteristics of the ESD structure.

For instance, the ESD structure includes a part of the peripheral wiring. The ESD structure has a total width not greater than that of the peripheral wiring in other parts without the ESD structure.

For instance, the ESD structure is also a wiring and connected with the peripheral wiring to form a complete wiring. When the display panel is subjected to an electrostatic shock, the wiring of the ESD structure can be more easily shocked compared with other parts of the peripheral wiring. As the total width of the wiring of the ESD structure is not greater than that of the other parts of the peripheral wiring without the ESD structure, it is possible that the width of the peripheral wiring is not increased during implementation. For instance, in instances that peripheral areas are coated with ultraviolet (UV) glue during the production and are irradiated by UV light, the wiring will not result in reduced UV transmittance of the peripheral areas and will not affect the curing effect, namely it will not affect the UV transmittance of the peripheral areas, meanwhile, it may also be applied in the narrow-bezel design as the width of the peripheral wiring is not increased.

The ESD structure is a weak point purposely added in the design, so that electrostatic energy can be discharged at the weak point. Several ways are designed in embodiments of the present disclosure to achieve the electrostatic protection function of the ESD structure. For instance, the ESD structure is designed to have larger resistance and have a tip and/or corner structure. But the embodiments of the present disclosure are not limited thereto. Other ways which allow the ESD structure to become an ESD weak point may also be adopted.

Example 1: With Larger Resistance

For instance, the resistance of the ESD structure is designed to be greater than that of other parts of the peripheral wiring without the ESD structure.

For instance, as illustrated in FIG. 1, as the resistance of the ESD structure 101 is designed to be greater than that of other parts of the peripheral wiring 102 without the ESD structure 101, when the display panel is subjected to an electrostatic shock, the ESD structure 101 with larger resistance is more easily shocked by the static electricity, so that the electrostatic energy can be discharged at the designed position, and the effect of protecting the entire wiring from being damaged can be achieved. In order to increase the resistance, a plurality of implementations may be adopted. For instance, the wirings on the ESD structure may be made to be thinner.

Example 2: With a Tip and/or Corner Structure

For instance, the ESD structure is designed to have the tip and/or corner structure.

For instance, as tip or corner positions are mostly shocked by static electricity, the ESD structure may be designed as a structure having tips or corners. When the electrostatic shock positions are concentrated there, the damaged positions may be repaired by the melted conductive material, so the normal functions of the peripheral wiring will not be affected.

For instance, the total length of the wiring per unit area of the ESD structure is greater than that of the wiring per unit area of other parts of the peripheral wiring without the ESD structure.

For instance, as illustrated in FIG. 1, the total length of the wiring per unit area of the ESD structure 101 is greater than that of the wiring per unit area of other parts of the peripheral wiring 102 without the ESD structure. That is to say, the wiring of the other parts of the peripheral wiring 102 without the ESD structure is a straight line, while the wiring of the ESD structure is a curved line having tips or corners.

The ESD structure may have a variety of structures, so that the ESD structure can become a weak position for static discharge. As for the instance that the ESD structure has the tip and/or corner structure, for instance, the wiring in the ESD structure can be S-shaped and/or Z-shaped.

As the power on the S-shaped or Z-shaped structure added on the peripheral wiring can be suddenly increased, the structure can be more easily shocked by static electricity. When the peripheral wiring includes one ESD structure, the wiring in the ESD structure may include one group of S-shaped structures or one group of Z-shaped structures. When the peripheral wiring includes a plurality of ESD structures, both S-shaped ESD structures and Z-shaped ESD structures may be included, or only a plurality of groups of S-shaped ESD structures may be included, or a plurality of groups of Z-shaped ESD structures may be included. But the embodiments of the present disclosure are not limited thereto.

Figure 2:
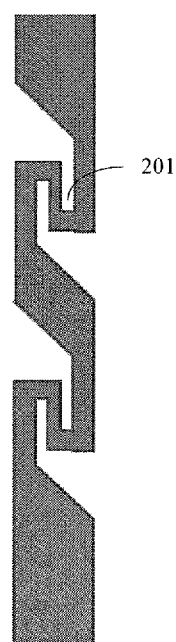
FIG. 2 is a schematic diagram of an S-shaped ESD structure provided by an embodiment of the present disclosure.

For instance, as illustrated in FIG. 2 which is a schematic diagram of an S-shaped ESD structure provided by an embodiment of the present disclosure, the wiring in the figure includes two etched continuous longitudinal S (may also be transverse S) shaped structures. In this way, the width of the wiring part in the ESD structure is suddenly reduced and the ESD structure is made to have corners 201, and the removed portions can be used for accommodating the melted conductive material. The longitudinal S-shaped structure and the transverse S-shaped structure have no difference in function and are both used for forming a weak point which can be easily shocked.

Figure 3:
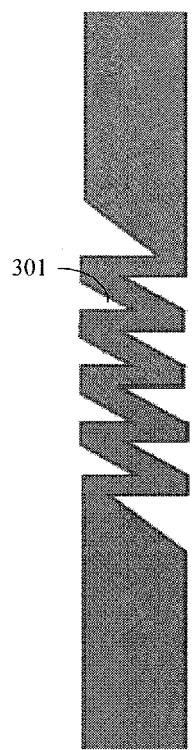
FIG. 3 is a schematic diagram of a Z-shaped ESD structure provided by an embodiment of the present disclosure.

For instance, as illustrated in FIG. 3 which is a schematic diagram of a Z-shaped ESD structure provided by an embodiment of the present disclosure, the wiring in the figure includes a plurality of etched continuous Z-shaped structures, so that the ESD structure can be a structure having tips 301, and the removed portions can be used for accommodating the melted conductive material.

The S-shaped structures and the Z-shaped structures may be formed by normal thin-film transistor (TFT) film forming, exposure and etching process. No additional device is added. The ESD structure may be formed at the same time when other layers are formed, so no manufacturing process is required to be added, and the cost can be saved.

The peripheral wiring may be a wiring disposed in the non-display areas of the array substrate and/or the opposite substrate. In order to more clearly demonstrate the positional relationship among the ESD structure, the peripheral wiring and the substrate, description is given below by taking the peripheral wiring disposed on the non-display area of the array substrate as an example.

Figure 4:
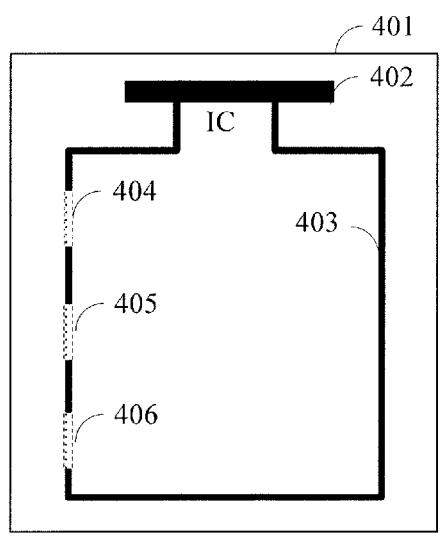
FIG. 4 is a schematic diagram of an array substrate including a peripheral wiring provided with ESD structures, provided by an embodiment of the present disclosure.

As illustrated in FIG. 4 which is a schematic diagram of an array substrate including a peripheral wiring provided with ESD structures. As shown in FIG. 4, an array substrate 401, a driver IC 402, a peripheral wiring 403, a first ESD structure 404, a second ESD structure 405 and a third ESD structure 406 are provided. The first ESD structure 404, the second ESD structure 405 and the third ESD structure 406 may be one group of S-shaped structures. As electrostatic energy will be conducted along leads or hop to the inside of a panel and hit weak points if not discharged, in the embodiment of the present disclosure, the ESD structures (namely weak points which can be easily shocked) are provided initiatively, so that the electrostatic energy can be discharged in the ESD structures purposely, and the display panel can be protected.

FIG. 4 only illustratively shows the position, the length and the like of the first ESD structure 404, the second ESD structure 405 and the third ESD structure 406, but these elements may all be varied. In addition, the spacing between two adjacent ESD structures may also be varied. For instance, as four corners of a display panel can be easily shocked by static electricity, ESD structures may be disposed in the four corners at high density, and one ESD structure may be distributed at a certain distance at other positions; or the ESD structures are distributed on the peripheral wiring (may be one wiring or a plurality of wirings) on the outermost of the display panel, so that the wiring on the outermost of the display panel is the first to be shocked by external static electricity, and the electrostatic protection to the internal wirings or structures can be achieved.

In the embodiment of the present disclosure, the ESD structures which can be easily shocked are additionally arranged on the peripheral wiring of the array substrate 401. When the display panel is subjected to an electrostatic shock, the ESD structure can be more easily shocked compared with the peripheral wiring 403 in other parts without the ESD structures, so that the static electricity can be discharged on the ESD structures of the peripheral wiring, and other parts of positions of the peripheral wiring cannot be shocked by static electricity. For instance, if the ESD structure 404 is shocked, tip structures, such as corners of the S-shaped or Z-shaped structure after being shocked can be melted and even broken, and the filling material in the sealant can be melted under high temperature. In this way, the melted conductive material can be filled into the damaged position and/or the ESD structure 404.

When the ESD structure 404 is shocked and repaired (one or more times), the features of the tips or corners may be lost, and the ESD structure can be converted into a normal metal wiring (namely converted into a non-weak point). In this way, if an electrostatic shock happens again, the ESD structure 405 which is not damaged and adjacent to (namely the closest to the shock point) the ESD structure 404 will be converted into a weak point and continuously bears electrostatic shock which may be happen again.

The peripheral wiring in the embodiments of the present disclosure may be a common signal line and may also be an additionally formed wiring special for shock. Detailed description will be given below.

For instance, the peripheral wiring is a signal line for transmitting signals during operation of the display panel and/or an ESD wiring disposed in a non-display area.

The wiring having the ESD structure may be a signal line having the function of signal transmission during the operation of the display panel and may also be an additionally formed ESD wiring special for shock. In this way, the ESD structure on the ESD wiring can be more easily shocked by static electricity. In this way, the wiring with normal function cannot be affected, and the display panel can have high antistatic effect in a long time.

For instance, the filling material of the sealant may be directly adopted to cover the ESD structure, or other layers may also be disposed between the filling material of the sealant and the ESD structure. Detailed description will be given below.

For instance, at least one barrier layer may also be disposed between the filling material of the sealant and the ESD structure.

For instance, the filling material of the sealant covers the entire ESD structure. Direct covering may be adopted, or covering via a barrier layer may also be adopted, namely a barrier layer is disposed between the filling material of the sealant and the ESD structure. The barrier layer is made from insulating material which can be melted when the temperature exceeds the preset temperature threshold when a shock happens. Therefore, when the display panel is subjected to an electrostatic shock, the conductive material in the filling material and the barrier layer may be melted under high temperature, and the melted conductive material will repair the damaged position and the ESD structure.

Based on the same concept, the embodiment of the present disclosure also provides a display device, which includes any foregoing display panel provided by the embodiments of the present disclosure. As the principles for solving the problems of the display device are similar to those of the display panel, the embodiments of the display device may refer to the embodiments of the display panel. No further description will be repeated herein.

In the embodiments of the present disclosure, as an ESD structure which can be easily shocked is additionally arranged on the peripheral wiring, when the display panel is subjected to an electrostatic shock, static electricity will be discharged on the ESD structure of the peripheral wiring. Moreover, as the filling material including the conductive material is provided in the sealant in the area corresponding to the ESD structure, the conductive material can be melted under high temperature produced in the process of electrostatic discharge, and the melted conductive material can be filled into the ESD structure on the peripheral wiring damaged by the electrostatic shock, so that the peripheral wiring can play its role continuously, and the display panel can have high antistatic effect in a long time.

The described above are only illustrative implementations of the present disclosure, and the present disclosure is not intended to limited thereto. For a person of ordinary skill in the art, various modifications and improvements can be made without departing from the spirit and scope of the present disclosure, and all of which shall fall within the protection scope of the present disclosure.

The application claims priority to the Chinese patent application No. 201510613281.2 filed on Sep. 23, 2015 and entitled "Display Panel and Display Device", which is incorporated herein by reference in its entirety.

What is claimed is:

1. A display panel, comprising, an array substrate and an opposite substrate arranged oppositely;
    a sealant disposed in non-display areas of the array substrate and the opposite substrate; and
    a peripheral wiring disposed in the non-display areas of the array substrate or the opposite substrate and including at least one electrostatic discharge (ESD) structure, wherein the sealant includes filling material in an area corresponding ng to the ESD structure; the filling material include conductive material wrapped by insulating material; the insulating material is insulated at normal temperature and melted when the temperature exceeds a preset temperature threshold; the conductive material is melted when the temperature exceeds the preset temperature threshold; and the preset temperature threshold is a temperature value produced when the ESD structure is exposed to static electricity.

2. The display panel according to claim 1, wherein the ESD structure includes a part of the peripheral wiring; and the ESD structure has a width not greater than that of the peripheral wiring in other parts without the ESD structure.

3. The display panel according to claim 2, wherein the ESD structure has resistance greater than that of the peripheral wiring in other parts without the ESD structure.

4. The display panel according to claim 2, wherein the ESD structure includes a tip or corner structure.

5. The display panel according to claim 4, wherein the ESD structure has a total length of wiring per unit area greater than that of the peripheral wiring in other parts without the ESD structure.

6. The display panel according to claim 5, wherein the ESD structure includes at least one of S-shaped structure and at least one of Z-shaped structure.

7. The display panel according to claim 5, wherein the ESD structure includes at least one of S-shaped structure.

8. The display panel according to claim 5, wherein the ESD structure includes at least one of Z-shaped structure.

9. The display panel according to claim 1, wherein the peripheral wiring includes a signal line configured to transmit signals during operation of the display panel and an ESD wiring disposed in the non-display area.

10. The display panel according to claim 1, wherein the peripheral wiring includes a signal line configured to transmit signals during operation of the display panel.

11. The display panel according to claim 1, wherein the peripheral wiring includes an ESD wiring disposed in the non-display area.

12. The display panel according to claim 1, further comprising; at least one barrier layer disposed between the filling material of the sealant and the ESD structure, wherein the barrier layer is made from insulating material which can be melted when the temperature exceeds the preset temperature threshold.

13. The display panel according to claim 1, wherein the ESD structure has resistance greater than that of the peripheral wiring in other parts without the ESD structure.

14. The display panel according to claim 3, wherein the ESD structure includes a tip or corner structure.

15. The display panel according to claim 4, wherein the ESD structure includes a tip or corner structure.

16. The display panel according to claim 1, wherein the ESD structure has a total length of wiring per unit area greater than that of the peripheral wiring in other parts without the ESD structure.

17. The display panel according to claim 1, wherein the peripheral wiring includes four ESD structures respectively disposed in four corners of the peripheral wiring.

18. A display device comprising a display panel that comprises:
- an array substrate and an opposite substrate arranged oppositely;
- a sealant disposed in non-display areas of the array substrate and the opposite substrate; and
- a peripheral wiring disposed in the non-display areas of the array substrate or the opposite substrate and including at least one electrostatic discharge (ESD) structure, wherein the sealant includes filling material in an area corresponding to the ESD structure; the filling material include conductive material wrapped by insulating material; the insulating material is insulated at normal temperature and melted when the temperature exceeds a preset temperature threshold; the conductive material is melted when the temperature exceeds the preset temperature threshold; and the preset temperature threshold is a temperature value produced when the ESD structure is exposed to static electricity.

* * * * *